US007868649B2

(12) United States Patent
Tanaka

(10) Patent No.: US 7,868,649 B2
(45) Date of Patent: Jan. 11, 2011

(54) DATA PROCESSING APPARATUS, METHOD OF CONTROLLING TERMINATION VOLTAGE OF DATA PROCESSING APPARATUS, AND IMAGE FORMING APPARATUS

(75) Inventor: Satoshi Tanaka, Chiba (JP)

(73) Assignee: Ricoh Company, Limted, Tokyo (JP)

( * ) Notice: Subject to any disclaimer, the term of this patent is extended or adjusted under 35 U.S.C. 154(b) by 22 days.

(21) Appl. No.: 12/206,188

(22) Filed: Sep. 8, 2008

(65) Prior Publication Data

US 2009/0077292 A1 Mar. 19, 2009

(30) Foreign Application Priority Data

Sep. 14, 2007 (JP) ............................ 2007-239240
Jun. 23, 2008 (JP) ............................ 2008-163490

(51) Int. Cl.
*H03K 17/16* (2006.01)
*H03K 19/003* (2006.01)

(52) U.S. Cl. ............................ 326/30; 326/56; 710/305

(58) Field of Classification Search ................... 326/30, 326/56-58; 710/305-316
See application file for complete search history.

(56) References Cited

U.S. PATENT DOCUMENTS

| | | | | |
|---|---|---|---|---|
| 6,968,413 | B2 * | 11/2005 | Cranford et al. | 710/300 |
| 7,212,028 | B2 * | 5/2007 | Shibata et al. | 326/30 |
| 7,671,606 | B2 * | 3/2010 | Gasperi | 324/652 |
| 2005/0285621 | A1 * | 12/2005 | Chen et al. | 326/30 |
| 2006/0107140 | A1 * | 5/2006 | Morioka | 714/724 |

FOREIGN PATENT DOCUMENTS

| | | |
|---|---|---|
| JP | 2006-331305 | 12/2006 |
| JP | 3956332 | 5/2007 |
| JP | 2008-27060 | 2/2008 |

* cited by examiner

*Primary Examiner*—James H. Cho
*Assistant Examiner*—Jason M Crawford
(74) *Attorney, Agent, or Firm*—Oblon, Spivak, McClelland, Maier & Neustadt, L.L.P.

(57) ABSTRACT

A processing unit carries out a predetermined data processing on the data in a storage unit. The storage unit is connected to the processing unit with a plurality of connecting lines. A voltage generating unit is connected to each of the connecting lines via a corresponding termination resistor and that generates a termination voltage to be applied to the connecting lines. An interrupting unit is connected between the connecting lines and the termination resistors, and it applies or does not apply the termination voltage to the connecting lines depending on a data processing state of the processing unit.

8 Claims, 12 Drawing Sheets

DATA PROCESSING APPARATUS, METHOD OF CONTROLLING TERMINATION VOLTAGE OF DATA PROCESSING APPARATUS, AND IMAGE FORMING APPARATUS

CROSS-REFERENCE TO RELATED APPLICATIONS

The present application claims priority to and incorporates by reference the entire contents of Japanese priority document 2007-239240 filed in Japan on Sep. 14, 2007 and Japanese priority document 2008-163490 filed in Japan on Jun. 23, 2008.

BACKGROUND OF THE INVENTION

1. Field of the Invention

The present invention relates to a data processing apparatus that has a circuit structure for applying a termination voltage to connecting lines that connect a data processing unit and a main storage device.

2. Description of the Related Art

A double data rate synchronous dynamic random access memory (DDR-SDRAM) has a function that shifts to a mode called a power down mode or a self refresh mode in which power consumption is reduced compared with normal operation. The DDR-SDRAM shifts to the power down mode or the self refresh mode if it is not accessed for more than a predetermined period of time. High speed signal circuits, such as the DDR-SDRAMs, are connected to a termination voltage connected to a data communication line and a controlling line between the data processing unit and a dynamic random access memory (DRAM), via a termination resistor. The termination voltage plays a role in reducing an erroneous operation caused by wave reflection specific to the high speed signal, and a shoulder (stepped waveform) resulting therefrom. However, because the termination resistor behaves as a simple pull-up resistor, when no data processing is performed, it is known that an unnecessary current flows from the termination voltage.

Various technologies that save power consumption in the power down mode or the self refresh mode have been developed. For example, Japanese Patent Application Laid-open No. 2006-331305 discloses a technology to reduce power consumption of the termination voltage and the data processing unit. This is enabled, in the power down mode or the self refresh mode, by providing a termination voltage system corresponding to each terminal logics of the data processing unit, dividing a voltage plane of the substrate, and by selecting whether to interrupt or to continue.

However, the technology disclosed in the Japanese Patent Application Laid-open No. 2006-331305 necessitates providing a power source system for each terminal logics. This structure makes the layout difficult as well as requires more space. A current of several amperes flows through the termination voltage. To cope with a current of this level, a voltage stabilizing unit such as a regulator is used as an interrupting unit. Use of the regulator increases the size and cost of the entire circuit. Moreover, when the regulator is used as the interrupting unit, it takes considerable time to stabilize the voltage when returning to the normal mode from the power down mode or the self refresh mode.

SUMMARY OF THE INVENTION

It is an object of the present invention to at least partially solve the problems in the conventional technology.

According to an aspect of the present invention, there is provided a data processing apparatus including a storage unit configured to store data and that functions as a main storage device; a processing unit configured to carry out a predetermined data processing on the data in the storage unit, the storage unit being connected to the processing unit with a plurality of connecting lines; a voltage generating unit that is connected to each of the connecting lines via a corresponding termination resistor and that generates a termination voltage to be applied to the connecting lines; and an interrupting unit that is connected between the connecting lines and the termination resistors, and that applies or does not apply the termination voltage to the connecting lines depending on a data processing state of the processing unit.

According to another aspect of the present invention, there is provided a method of controlling termination voltage implemented on a data processing apparatus. The data processing apparatus includes a storage unit configured to store data and that functions as a main storage device; a processing unit configured to carry out a predetermined data processing on the data in the storage unit, the storage unit being connected to the processing unit with a plurality of connecting lines; and a voltage generating unit that is connected to each of the connecting lines via a corresponding termination resistor and that generates a termination voltage to be applied to the connecting lines. The method includes applying or not applying the termination voltage to the connecting lines depending on a data processing state of the processing unit.

According to still another aspect of the present invention, there is provided an image forming apparatus including a storage unit configured to store data and that functions as a main storage device; a processing unit configured to carry out a predetermined image processing on the data in the storage unit, the storage unit being connected to the processing unit with a plurality of connecting lines; a voltage generating unit that is connected to each of the connecting lines via a corresponding termination resistor and that generates a termination voltage to be applied to the connecting lines; and an interrupting unit that is connected between the connecting lines and the termination resistors, and that applies or does not apply the termination voltage to the connecting lines depending on a data processing state of the processing unit.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Exemplary embodiments of the present invention are described below in greater detail with reference to the accompanying drawings.

Figure 1:
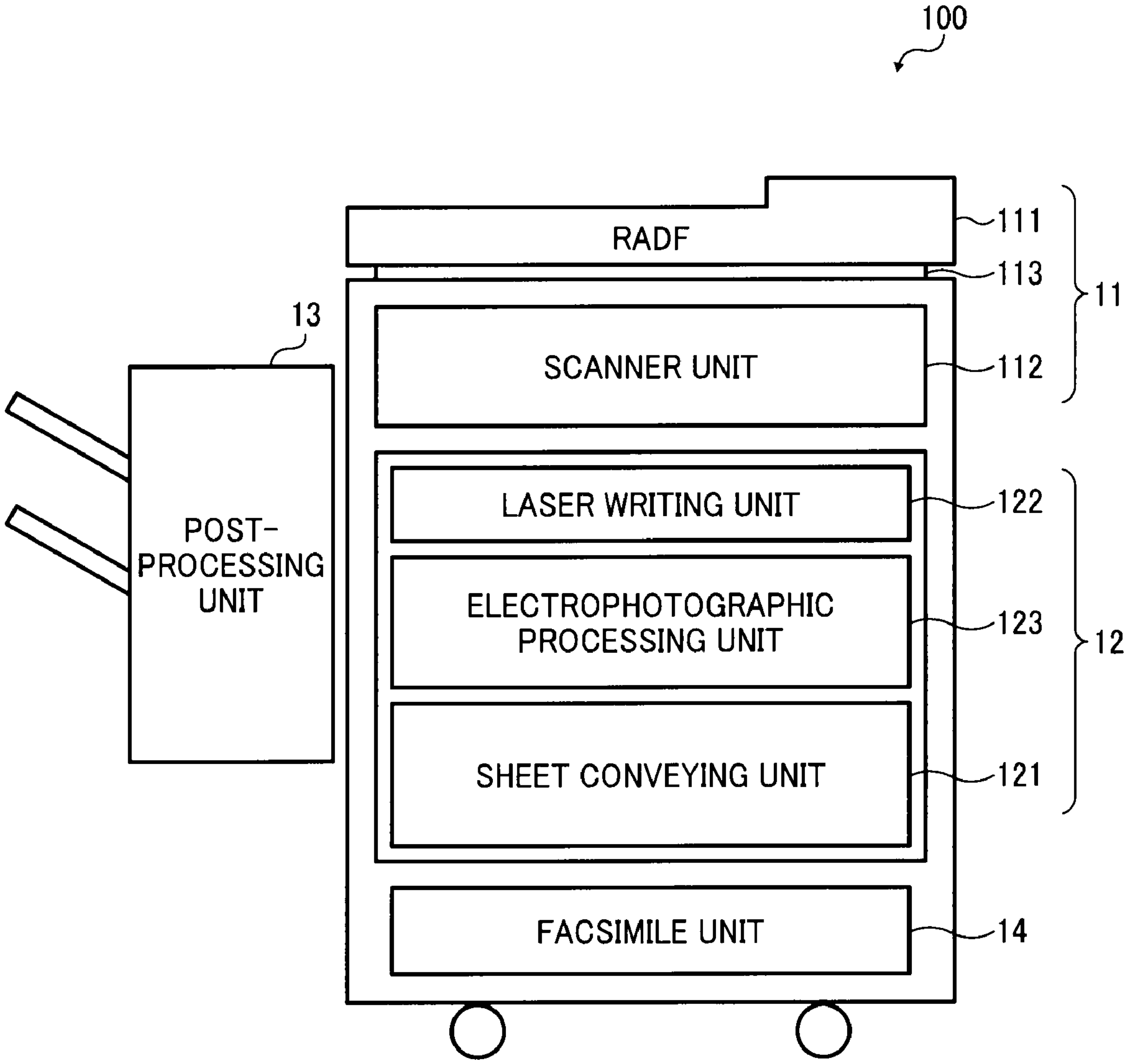
FIG. 1 is an overall schematic of an image forming apparatus according to an aspect of the present invention.

FIG. 1 is an overall block diagram of an image forming apparatus 100 according to a first embodiment of the present invention. The image forming apparatus 100 is a multi-functional peripheral (MFP) that includes a plurality of functions. The image forming apparatus 100 includes a reading unit 11, an image forming unit 12, a post-processing unit 13, and a facsimile unit 14. The reading unit 11 includes a recirculating automatic document feeder 111 (hereinafter, "RADF"), a scanner unit 112, and a platen 113. The image forming unit 12 includes a sheet conveying unit 121, a laser writing unit 122, and an electrophotographic processing unit 123.

The reading unit 11 and the image forming unit 12 are operative to form an image and print out the image on a sheet of paper. The post-processing unit 13 carries out processes such as arranging, stapling, and punching of the output sheets.

The RADF 111 includes a one-sided document feed path and a double-sided document feed path, and can correspond to either a one-sided document or a double-sided document. The one-sided document feed path starts from a document tray, which is not shown, to a discharge tray, which is not shown, via the platen 113. The double-sided document feed path reverses the surface of an original of which the scanner unit 112 has finished reading an image on one side, and guides the original again to the platen. The scanner unit 112 irradiates the original with a lamp, and focuses reflection light of the original on a light-receiving surface of a photoelectric conversion element using a lens, a mirror, and the like. The photoelectric conversion element converts the reflection light on the surface of the original into an electric signal, and outputs to a main substrate 15 with a charge transport layer (CTL), which will be described later. Image data read by the reading unit 11 is then output to the image forming unit 12.

The image forming unit 12 includes the sheet conveying unit 121 that conveys a sheet of paper, the laser writing unit 122, and the electrophotographic processing unit 123. The sheet conveying unit 121 includes a sub-conveying path that, while in a double-sided copying mode that forms an image on both sides of the sheet, reverses the sheet that has passed through a fixing roller and guides thereof to the electrophotographic processing unit 123 again.

The laser writing unit 122 distributes a semiconductor laser that emits laser light and light emitted from the semiconductor laser, based on image data supplied from the main substrate 15 with the CTL, which will be described later, on a surface of a photosensitive drum of the electrophotographic processing unit 123, via mirrors and lenses. An electrostatic latent image is formed on the surface of the photosensitive drum, and by supplying a toner from a developing device, a toner image is exposed.

The toner image is transferred on the sheet guided from the sheet conveying unit 121, heated and pressurized by the fixing roller, and is fixed on the surface of the sheet by melting the toner image. After having been written in this manner, the processes such as arranging, stapling, and punching are carried out on a part of the output sheets at the post-processing unit 13, and are discharged to a tray. In the first embodiment, a printing method used in the image forming unit 12 is an electrophotographic method. However, other printing methods such as an ink-jet method, a sublimation thermal transfer method, a direct thermal recording method, and a melting thermal transfer method can be used.

The facsimile unit 14 transmits a facsimile signal that carries image data read by the reading unit 11, and image data supplied from the main substrate 15 with the CTL, which will be described later, via a telephone line (for example, an analog public network PSTN (public switched telephone network)). The facsimile unit 14 also outputs the received facsimile signal to the main substrate 15 with the CTL, via the telephone line.

Figure 2:
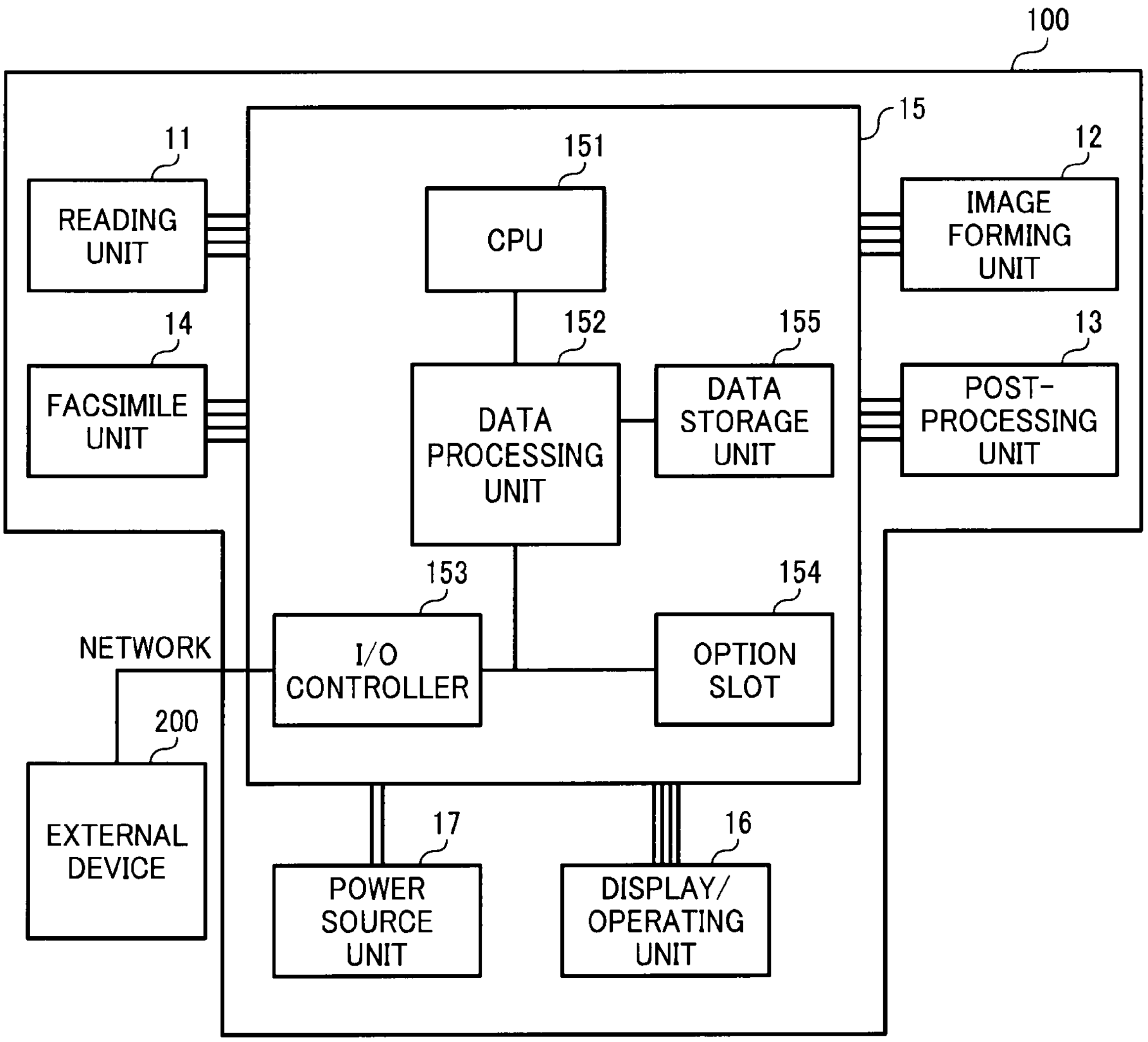
FIG. 2 is a detailed block diagram of the image forming apparatus shown in FIG. 1.

The detailed structure and functions of the image forming apparatus 100 will now be explained with reference to FIG. 2. FIG. 2 is a detailed block diagram of the image forming apparatus 100. As shown in FIG. 2, the image forming apparatus 100 includes function units that correspond to image formation performed by the reading unit 11, the image forming unit 12, the post-processing unit 13, and the facsimile unit 14. The image forming apparatus 100 also includes the main substrate 15 with the CTL, a display/operating unit 16, and a power source unit 17.

The main substrate 15 with the CTL includes a central processing unit (CPU) 151, a data processing unit 152, an input/output (I/O) controller 153, an option slot 154, and a data storage unit 155.

The CPU 151 is a central processing device that controls the overall operation of the image forming apparatus 100. For example, the CPU 151 initializes each of the units in the image forming apparatus 100, and executes various types of processes that correspond to shifting and returning to and from an energy saving mode, which will be described later, the image formation, and the like. These are enabled by executing a predetermined program data stored in the data storage unit 155.

The data processing unit 152 is a function unit that, under the control of the CPU 151, executes a predetermined data processing that corresponds to an operation performed by the image forming apparatus 100. For example, the data processing unit 152 performs a predetermined image processing with respect to image data received from the I/O controller 153, and image data stored in the data storage unit 155. Details of the data processing unit 152 will be described later.

The I/O controller 153 is a communication control circuit that includes an interface for connecting to an external device 200, via a network, such as the Internet. More specifically, the I/O controller 153 outputs the image data transmitted from the external device 200 to the data processing unit 152.

The option slot 154 is a slot (bridge) to connect a universal serial bus (USB) device, an Institute of Electrical and Electronics Engineers (IEEE) 1394 device, and the like. However, the types of the devices to be connected are not limited to these, and it is possible to provide a slot that corresponds to the standardization of the device to be used.

The data storage unit 155 stores therein image data printed by the image forming apparatus 100, and the image data is stored in a storage medium such as a hard disk drive (HDD) device. The data storage unit 155 stores therein in advance various types of computer program/data and setting information that correspond to the control of the image forming apparatus 100.

The display/operating unit 16 is an input device of a touch panel type that, under the control of the CPU 151, for example, displays a message that urges a user to operate and performs various displays indicating a processing status. The display/operating unit 16 also receives an input such as the setting of printing conditions that correspond to the image formation. In the first embodiment, the display/operating unit 16 is integrally formed with an input device and a display device. However, it is not limited to this, and the input device and the display device may be formed separately.

The power source unit 17 converts power supplied from an external commercial power source to the power required in the image forming apparatus 100, and supplies thereof to each of the units in the image forming apparatus 100.

Figure 3:
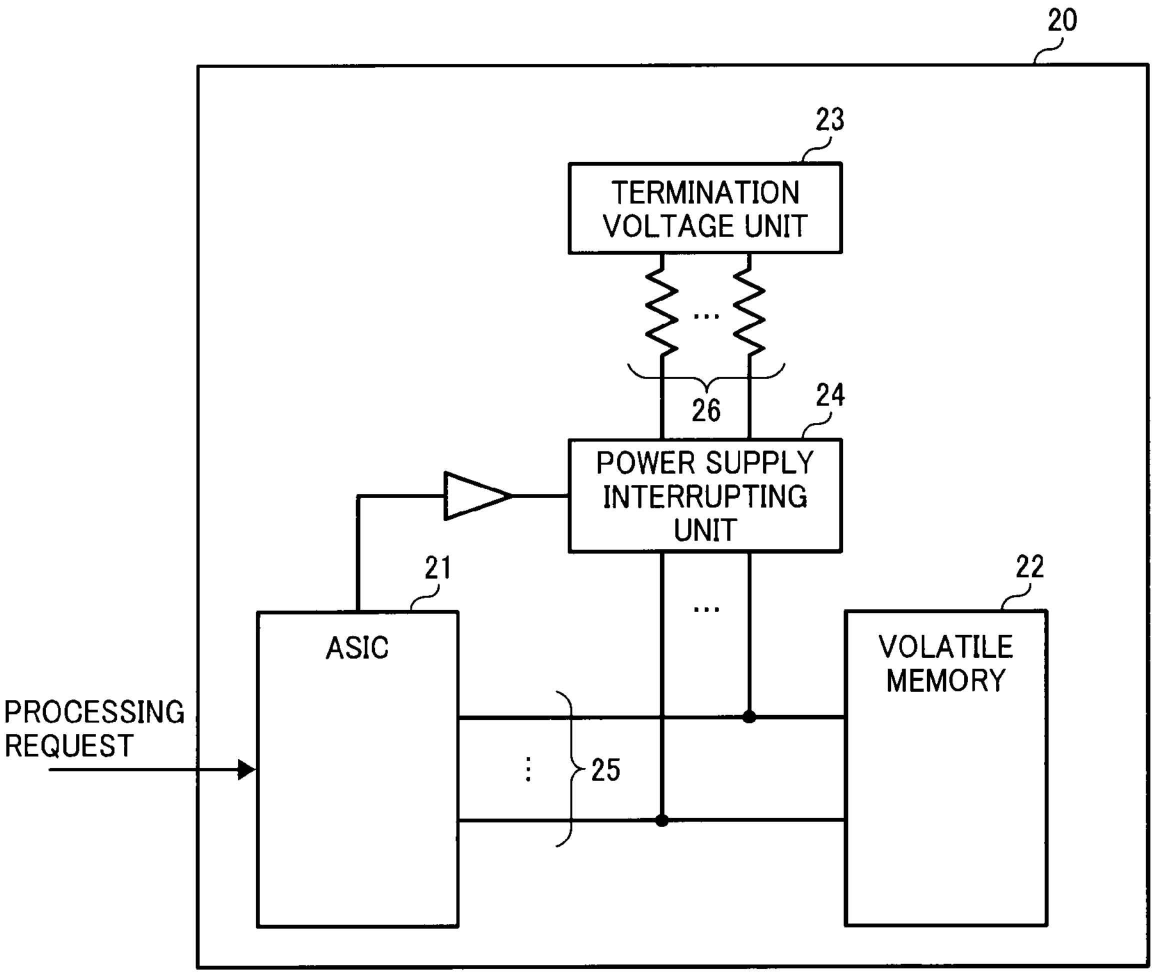
FIG. 3 is a block diagram of a data processing unit according to a first embodiment of the present invention.

FIG. 3 is a block diagram of a data processing unit 20 according to the first embodiment that can be employed as the data processing unit 152. The data processing unit 20 includes application specific integrated circuits (ASIC) 21, a volatile memory 22, a termination voltage unit 23, and a power supply interrupting unit 24.

The ASIC 21 is an integrated circuit that is, under the control of the CPU 151, prepared for a predetermined data processing that corresponds to the operation performed by the image forming apparatus 100. More specifically, when a request for executing a predetermined data processing is received from the CPU 151 and the like, the ASIC 21 executes the requested data processing by using the volatile memory 22 as a work area. The volatile memory 22 is connected to the ASIC 21 with connecting lines 25.

The volatile memory 22 is a main storage device of the image forming apparatus 100. A double data rate synchronous dynamic random access memory (DDR-SDRAM), a dynamic random access memory (DRAM), and the like may be used as the volatile memory 22. The volatile memory 22 shifts to the power down mode or the self refresh mode if it is not accessed by the ASIC 21 for more than a predetermined period of time.

The termination voltage unit 23 is a power source circuit for supplying a termination voltage to terminate a signal between the ASIC 21 and the volatile memory 22. The termination voltage unit 23 is connected to each of the connecting lines 25 via a corresponding termination resistor 26.

The power supply interrupting unit 24 is connected between the termination resistor 26 and the connecting lines 25. Depending on a control signal fed from the ASIC 21, the power supply interrupting unit 24 turns on (supply)/off (interrupt) the termination voltage to be applied to each of the connecting lines 25 from the termination voltage unit 23. In this manner, by providing the power supply interrupting unit 24 at the downstream side of the termination resistor 26, when viewed from the termination voltage unit 23, the current that flows through the power supply interrupting unit 24 can be suppressed. Accordingly, it is possible to use a small and inexpensive semiconductor switch as the power supply interrupting unit 24.

For example, a bus switch that is a semiconductor switch that can turn on/off a plurality of connections can be used as the power supply interrupting unit 24. By using the bus switch, it is possible to turn on/off the termination voltage applied to each of the connecting lines 25 from the termination voltage unit 23 all at one time, depending on the control signal (high (H) level/low (L) level) received from the ASIC 21.

In this configuration, when the volatile memory 22 is in the power down mode or the self refresh mode, terminals of the volatile memory 22 are in high impedance state. However, because each terminal of the ASIC 21 has a different logic, the terminals of the ASIC 21 can be in any of a high (H) level state, a low (L) level state, or a high impedance state. A drive current (first current) flows to a terminal that is in a low (L) level state and to the termination voltage unit 23 from a terminal that is in a high (H) level state. Moreover, the terminal that is in a low (L) level state pulls in current (second current) from the terminal that is in a high (H) level state and the termination voltage unit 23. In other words, even if the ASIC 21 is not performing any process, two currents, first and second, flow therethrough. As a result, unnecessary current is drawn from the termination voltage unit 23.

The ASIC 21 controls the power supply interrupting unit 24 so as to interrupt the power supply from the termination voltage unit 23. As a result, the two unnecessary currents are not generated. More specifically, the ASIC 21, when it is not performing any processing, interrupts the termination voltage to be supplied to the connecting lines 25 from the termination voltage unit 23, using the power supply interrupting unit 24. This is enabled by outputting a control signal that turns off (interrupt) the power to the power supply interrupting unit 24.

Figure 4:
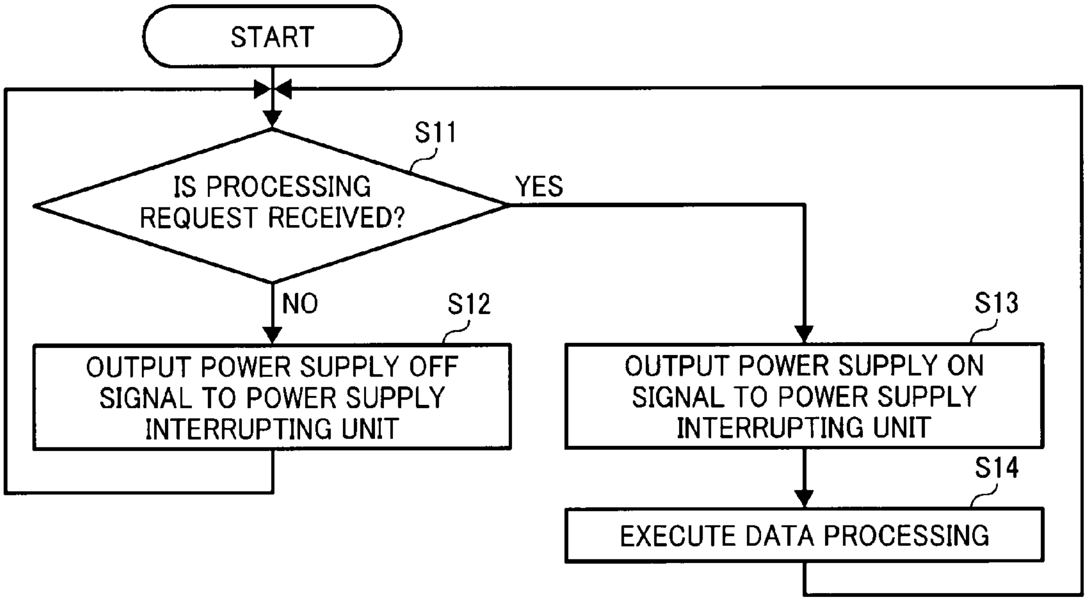
FIG. 4 is a flowchart of a power supply control performed by an ASIC shown in FIG. 3.

An operation performed by the ASIC 21 will now be explained below with reference to FIG. 4. FIG. 4 is a flowchart of a processing procedure of a power supply control performed by the ASIC 21.

The ASIC 21 determines whether a request for executing the data processing is received from the CPU 151 (Step S11). If no request is received (No at Step S11), the ASIC 21 outputs a control signal (power supply OFF signal) that interrupts the power to the power supply interrupting unit 24 (Step S12), and returns again to the processing at Step S11. The data processing requested from the CPU 151 includes, for example, a process for storing data read by the reading unit 11 to the volatile memory 22, a process for reading image data stored in the volatile memory 22, and a predetermined image processing with respect to the image data. However, the data processing is not limited to these.

At Step S11, if a request is received (Yes at Step S11), the ASIC 21 outputs a control signal (power supply ON signal) that instructs to supply power to the power supply interrupting unit 24 (Step S13). The ASIC 21 then executes the requested data processing while using the volatile memory 22 as the work area (Step S14), and returns again to the processing at Step S11.

By performing the power supply process, the ASIC 21 can interrupt the termination voltage to be supplied to the connecting lines 25 from the termination voltage unit 23, while the ASIC 21 is not performing the process, that is, while the volatile memory 22 is in the power down mode or the self refresh mode.

In this manner, it is possible to turn off (interrupt) the termination voltage, by the power supply interrupting unit 24 connected between the connecting lines 25 and the termination resistor 26, if there is no data to be processed in the ASIC 21. Accordingly, it is possible to effectively reduce the power consumption of the termination voltage. Because the current that flows through the power supply interrupting unit 24 can also be suppressed, it is possible to use a small and inexpensive semiconductor switch as the power supply interrupting unit 24. Accordingly, it is possible to suppress an increase in the size and cost of the circuit that corresponds to the power supply interrupting unit 24.

An example of a structure in which a field effect transistor, which is a semiconductor switch, is used as the power supply interrupting unit 24 will now be explained. The elements being the same as those of the first embodiment are denoted by the same reference numerals, and the descriptions thereof will be omitted accordingly.

Figure 5:
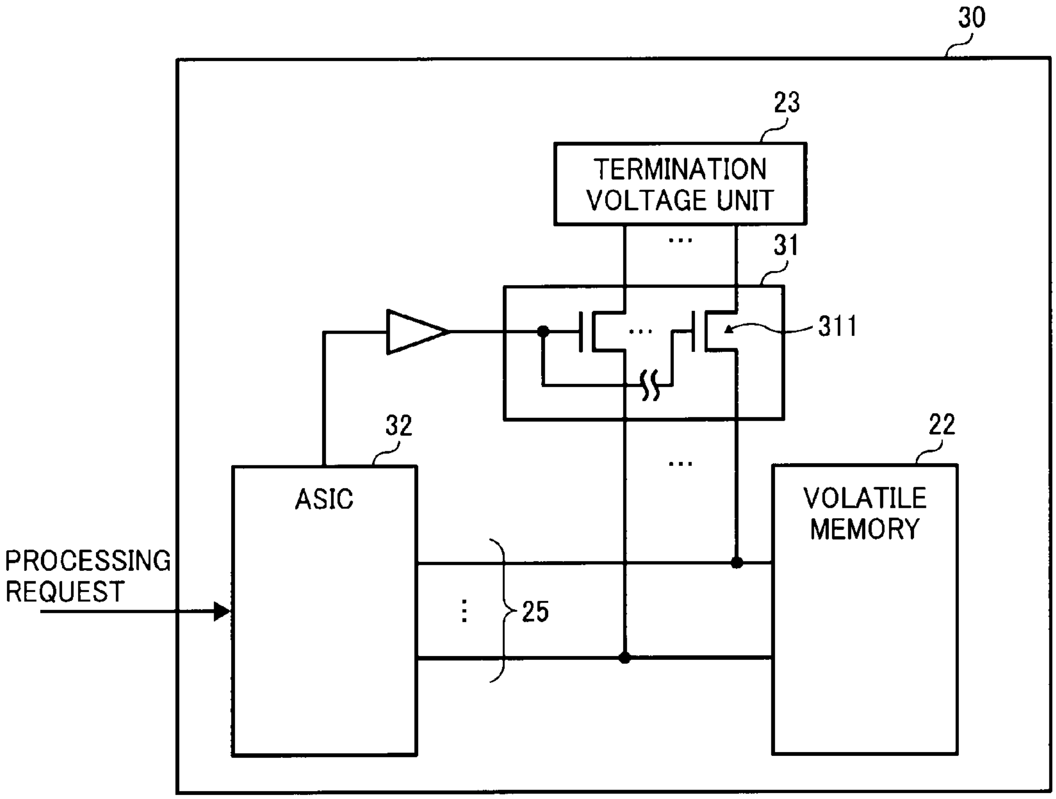
FIG. 5 is a block diagram of a data processing unit according to a second embodiment of the present invention.

FIG. 5 is a block diagram of a data processing unit 30 according to a second embodiment that can be used as the data processing unit 152. The data processing unit 30 includes an ASIC 32, the volatile memory 22, the termination voltage unit 23, and a power supply interrupting unit 31.

The power supply interrupting unit 31 includes field effect transistors (FET) 311 in number that corresponds to the number of the connecting lines 25, and the termination voltage unit 23 and each of the connecting lines 25 are connected by the FET 311. More specifically, the power supply interrupting unit 31 is formed so that the termination voltage unit 23 and each of the connecting lines 25 are connected via a drain terminal and a source terminal of each of the FETs 311, and a control signal from the ASIC 32 is fed into the gate terminal of each of the FETs 311.

A basic operation performed by the ASIC 32 is the same as that of the ASIC 21. However, when the ASIC 32 is not performing any processing, the ASIC 32 increases resistance between the drain and the source of each of the FETs 311, by outputting a control signal of a low (L) level to the gate terminal of each of the FETs 311. Accordingly, the ASIC 32 interrupts the termination voltage to be supplied to the connecting lines 25 from the termination voltage unit 23, using the power supply interrupting unit 31. The control signal of a low (L) level should be smaller than a pinch-off voltage of the FET 311.

The ASIC 32, during the period that the data processing is performed in the circuit of the ASIC 32, reduces resistance between the drain and the source of each of the FETs 311, by outputting a control signal of a high (H) level to the gate terminal of each of the FETs 311. Accordingly, the ASIC 32 controls so that the termination voltage is supplied to the connecting lines 25 from the termination voltage unit 23, using the power supply interrupting unit 31. The control signal of a high (H) level should be larger than the pinch-off voltage of the FET 311.

If the FET 311 is used as the power supply interrupting unit 31, a resistance is generated when the power is supplied, due to the device characteristics of the FET. Therefore, as shown in FIG. 5, it is possible to omit the termination resistor 26 by treating the resistance as the termination resistor 26.

In this manner, the termination voltage can be turned off (interrupt), if there is no data to be processed in the ASIC 21, using the power supply interrupting unit 31 connected between the connecting lines 25 and the termination resistor 26. Accordingly, it is possible to effectively reduce the power consumption of the termination voltage. Because a small and inexpensive semiconductor switch can be used as the power supply interrupting unit 31, it is possible to suppress an increase in size and cost of the circuit that corresponds to the power supply interrupting unit 31. The termination resistor can be eliminated, by using the resistance included in the semiconductor switch when the power is supplied. Accordingly, it is possible to reduce the number of components.

An enhancement type FET is shown in FIG. 5. However, a depression-type FET can be used. In this case, it is possible to correspond by reversing the logic of the control signal fed into the power supply interrupting unit 31 from the ASIC 32, from that of the present structure. Other semiconductor switch such as a metal-oxide semiconductor field-effect transistor (MOSFET) may also be used.

As a modification, among the terminals of the ASIC 32, the connecting line 25 connected to a terminal in a high impedance state can be short-circuited to the termination voltage unit 23, without going through the power supply interrupting unit 31. A modification of the data processing unit 30 will now be explained with reference to FIG. 6.

Figure 6:
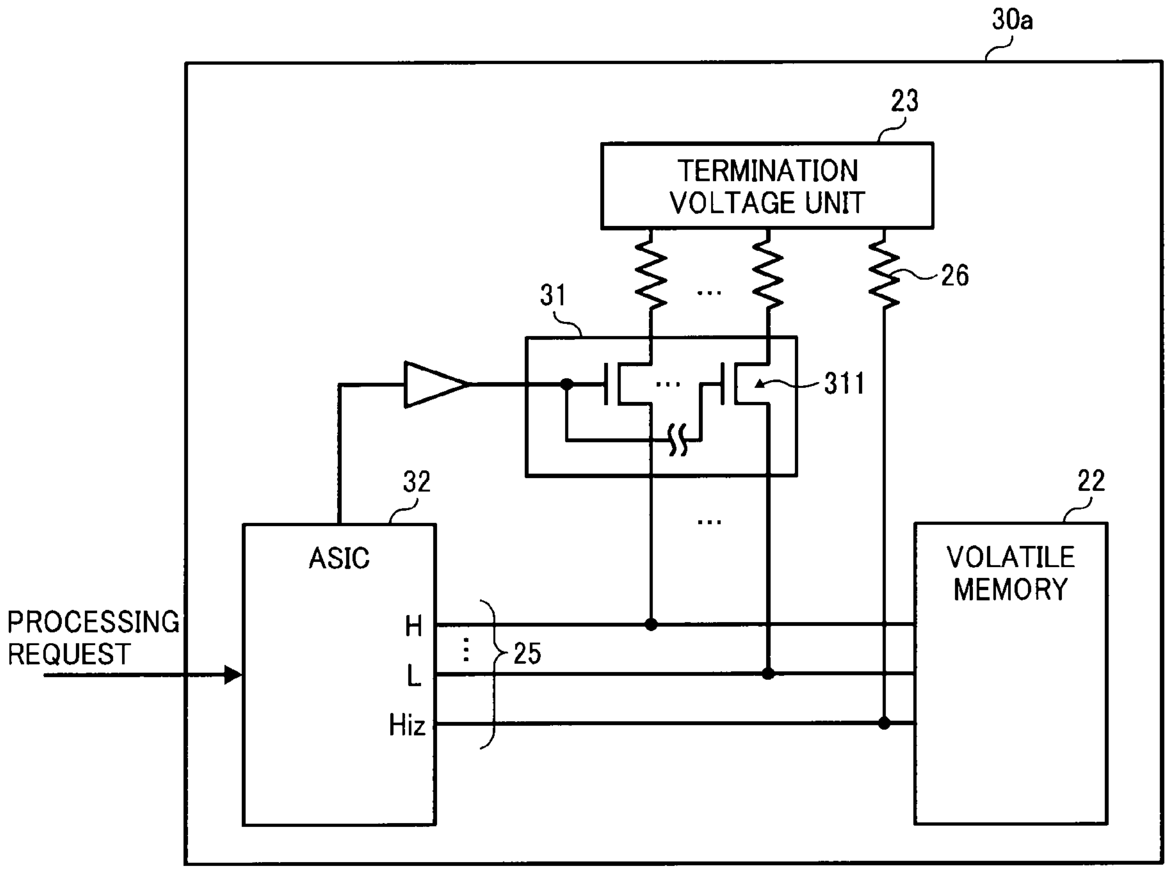
FIG. 6 is a block diagram of a modification of the data processing unit shown in FIG. 5.

FIG. 6 is a block diagram of a data processing unit 30*a* that is a modification of the data processing unit 30. As shown in FIG. 6, the data processing unit 30*a* includes the ASIC 32, the volatile memory 22, the termination voltage unit 23, and the power supply interrupting unit 31, as in the data processing unit 30.

The data processing unit 30*a* is formed that, while the volatile memory 22 is in the power down mode or the self refresh mode, the power supply interrupting unit 31 is not connected to the connecting line 25 in which the logic of the terminal of the ASIC 32 is in a high impedance (Hiz) state. In other words, with the connecting line 25 in which the logic of the terminal of the ASIC 32 is in a high impedance (Hiz) state, the termination voltage is continuously applied from the termination voltage unit 23.

In this manner, while the volatile memory 22 is in the power down mode or the self refresh mode, the terminal of the volatile memory 22 is in a high impedance state. Therefore, the current does not flow into the connecting line 25 connected between the terminal of the ASIC 32 in which the logic of the terminal is in a high impedance (Hiz) state, and the terminal of the volatile memory 22. In other words, the data processing unit 30*a* is formed so that the power supply control by the power supply interrupting unit 31 is kept to the required minimum, compared with that of the data processing unit 30. Accordingly, it is possible to reduce the number of FETs 311 that forms the power supply interrupting unit 31, compared with that of the data processing unit 30.

With the structure shown in FIG. 6, the termination voltage unit 23 and the connecting lines 25 are connected via the termination resistor 26. However, if the resistance of the power supply interrupting unit 31 can be used as the termination resistor 26, it is possible to treat the power supply interrupting unit 31 as the termination resistor 26.

As a third embodiment, an example that the power supply interrupting unit 31 performs the power supply control, by using a clock enable (CKE) signal output from the ASIC will be explained. The elements being the same as those of the first embodiment and the second embodiment are denoted by the same reference numerals, and the descriptions thereof will be omitted accordingly.

Figure 7:
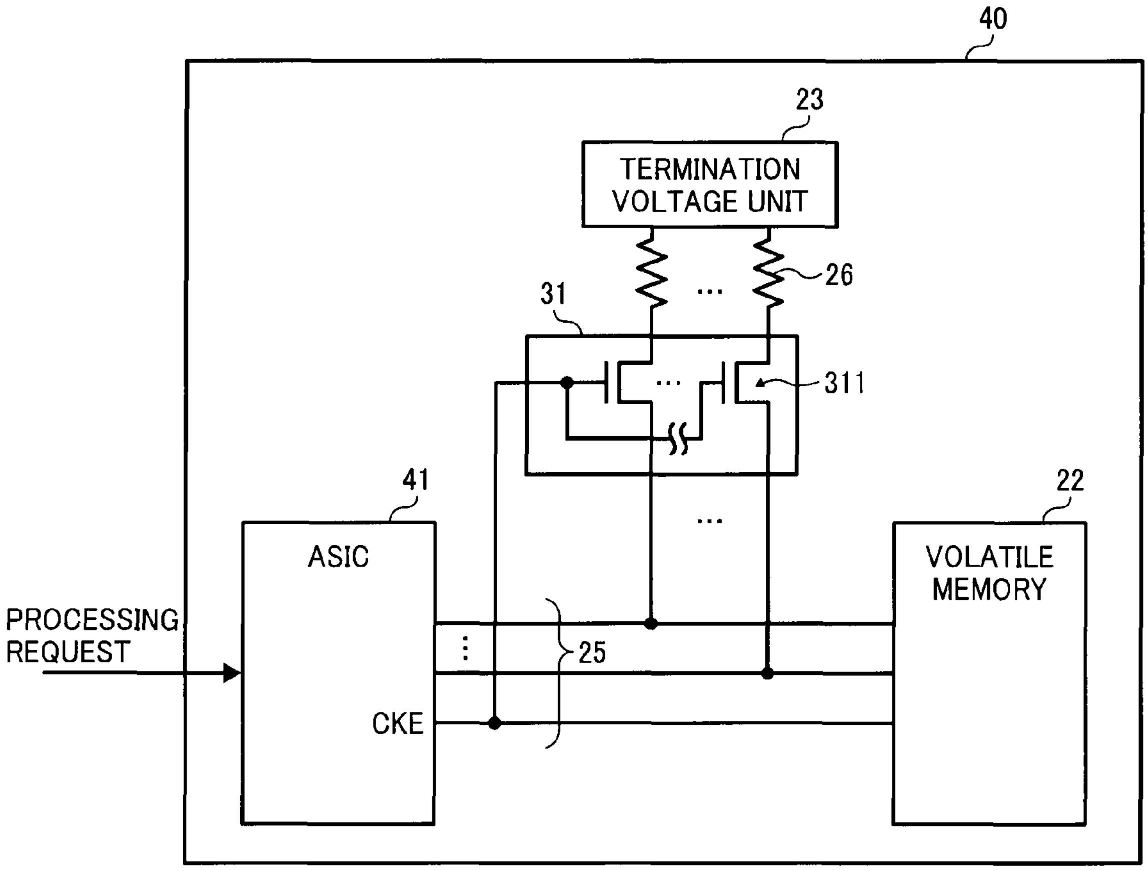
FIG. 7 is a block diagram of a data processing unit according to a third embodiment of the present invention.

FIG. 7 is a block diagram of a data processing unit 40 according to a third embodiment that can be used as the data processing unit 152. The data processing unit 40 includes an ASIC 41, the volatile memory 22, the termination voltage unit 23, and the power supply interrupting unit 31.

The ASIC 41 includes a terminal that outputs the CKE signal, and outputs the CKE signal to the volatile memory 22, via the connecting lines 25 connected to the terminal. The CKE signal is a signal that is turned to a high (H) level when the ASIC 41 is performing data processing, and is turned to a low (L) level when the ASIC 41 is not performing data processing. At the volatile memory 22, based on the level of the CKE signal being received, it is possible to determine whether the ASIC 41 is performing the data processing.

The gate terminal of each of the FETs 311 included in the power supply interrupting unit 31 is short-circuited to the connecting lines 25 connected to an output terminal of the CKE signal in the ASIC 41. The CKE signal output from the ASIC 41 is fed into the gate terminal of each of the FETs 311. The connecting line 25 connected to the output terminal of the CKE signal in the ASIC 41 is excluded from being controlled by the power supply interrupting unit 31.

Each of the FETs 311 of the power supply interrupting unit 31 on/off controls of the power supply to each of the connecting lines 25 from the termination voltage unit 23, depending on the level of the CKE signal received from the gate terminal. In other words, the power supply interrupting unit 31, while the CKE signal is in a high (H) level, in other words, while the ASIC 41 performs the data processing, controls so that the termination voltage is supplied to the connecting lines 25 from the termination voltage unit 23. The power supply interrupting unit 31, while the CKE signal is in a low (L) level, in other words, while the ASIC 41 does not perform the data processing, interrupts the termination voltage to be supplied to the connecting lines 25 from the termination voltage unit 23.

Figure 8:
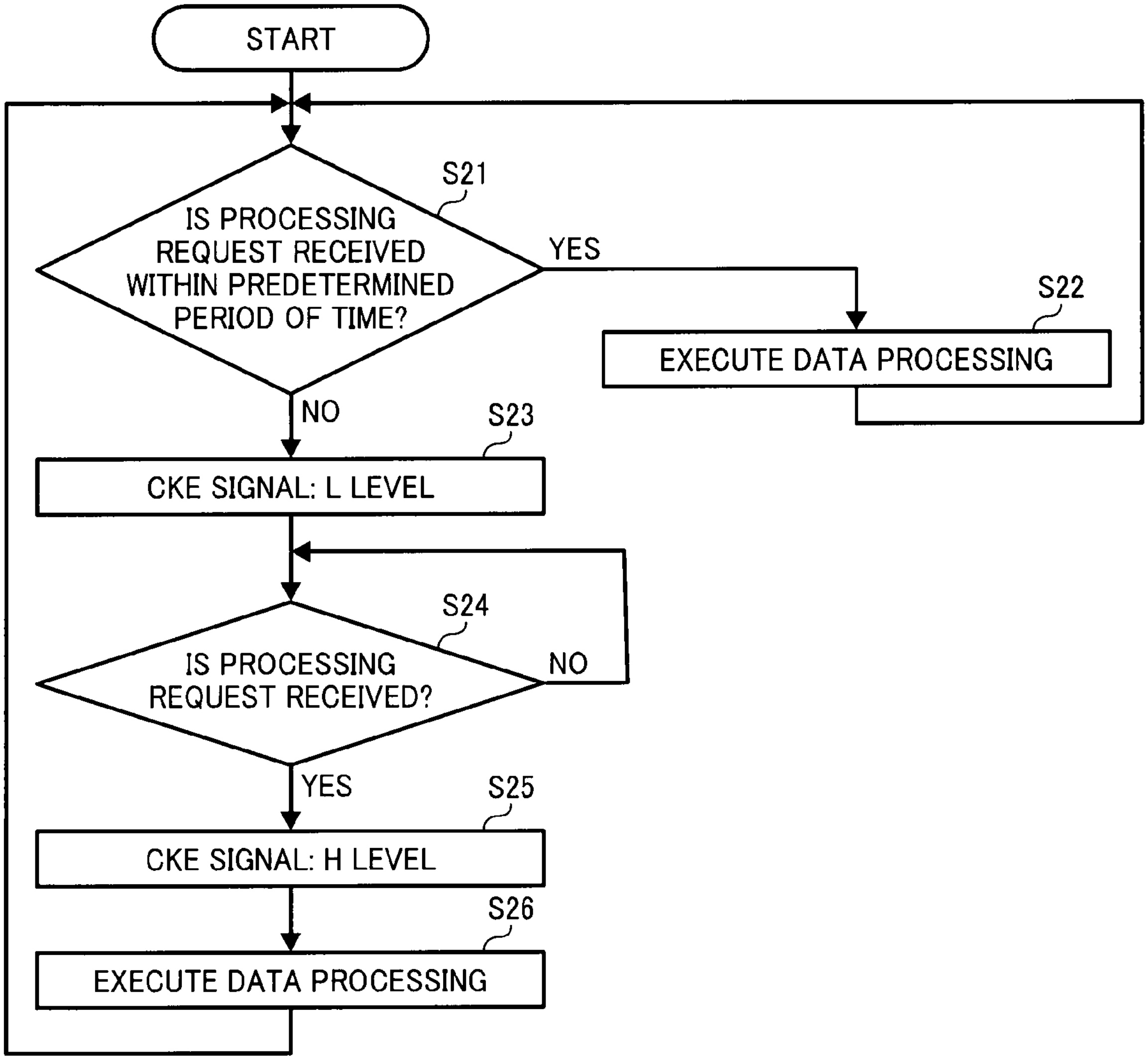
FIG. 8 is a flowchart of a power supply control performed by an ASIC shown in FIG. 7.

An operation performed by the data processing unit 40 will now be explained with reference to FIG. 8. FIG. 8 is a flowchart of the power supply control executed by the ASIC 41. As the initial state of the present process, the ASIC 41 keeps the CKE signal in a high (H) level state, after executing the data processing requested from the CPU 151.

The ASIC 41 determines whether a request for executing the data processing is received from the CPU 151, within a predetermined period of time from the previous input (Step S21). If it is determined that the processing request is received within the predetermined period of time (Yes at Step S21), the ASIC 41 executes the requested data processing, while using the volatile memory 22 as the work area (Step S22), and returns again to the processing at Step S21. The predetermined period of time that is an input interval of the processing request may be of any length, but for example, may coincide with the shifting time of the volatile memory 22 to the energy saving mode.

At Step S21, if it is determined that the processing request is not received within the predetermined period of time (No at Step S21), the ASIC 41 turns the CKE signal to a low (L) level (Step S23), and shifts to the processing at Step S24. With the processing at Step S23, the power supply interrupting unit 31 interrupts the termination voltage to the connecting lines 25 from the termination voltage unit 23, and the volatile memory 22 shifts to the energy saving mode (power down mode or self refresh mode).

At the following Step S24, the ASIC 41 waits until the processing request from the CPU 151 is received (No at Step S24). If it is determined that the processing request is received (Yes at Step S24), the ASIC 41 turns the CKE signal for executing the requested data processing to a high (H) level (Step S25). With the processing at Step S25, the power supply interrupting unit 31 turns the termination voltage to the connecting lines 25 from the termination voltage unit 23 in a power supplied state, and the volatile memory 22 cancels the energy saving mode. Subsequently, the ASIC 41 executes the requested data processing, while using the volatile memory 22 as the work area (Step S26), and returns again to the processing at Step S21.

In this manner, the termination voltage can be turned off, if there is no data to be processed in the ASIC 41, by using the existing signal (CKE signal) in the ASIC 41, without preparing a function for controlling the power supply interrupting unit 31. Accordingly, it is possible to suppress an increase in the number of components and in cost, and effectively reduce the power consumption of the termination voltage.

When the logic of the CKE signal is output in an inverted state, it is possible to perform the power supply control of the power supply interrupting unit 31, by using the existing signal in the ASIC 41, as described above. This is enabled by providing a separate inverting circuit (NOT element) that inverts the level of the CKE signal, inverting the CKE signal output from the ASIC 41 using the inverting circuit, and feeding thereof into the gate terminal of each of the FETs 311. An FET 312 in a depression-type, which will be described later, may also be used.

In the structure shown in FIG. 7, the termination voltage unit 23 and the connecting lines 25 are connected via the termination resistor 26. However, if the resistance of the power supply interrupting unit 31 can be used as the termination resistor 26, the power supply interrupting unit 31 may be used as the termination resistor 26.

As a fourth embodiment, an example of a structure that can invalidate the contribution of the CKE signal to the power supply interrupting unit 31, in the structure that the CKE signal explained in the third embodiment is used, will be explained. The elements being the same as those of the first embodiment, the second embodiment, and the third embodiment are denoted by the same reference numerals, and the descriptions thereof will be omitted accordingly.

Figure 9:
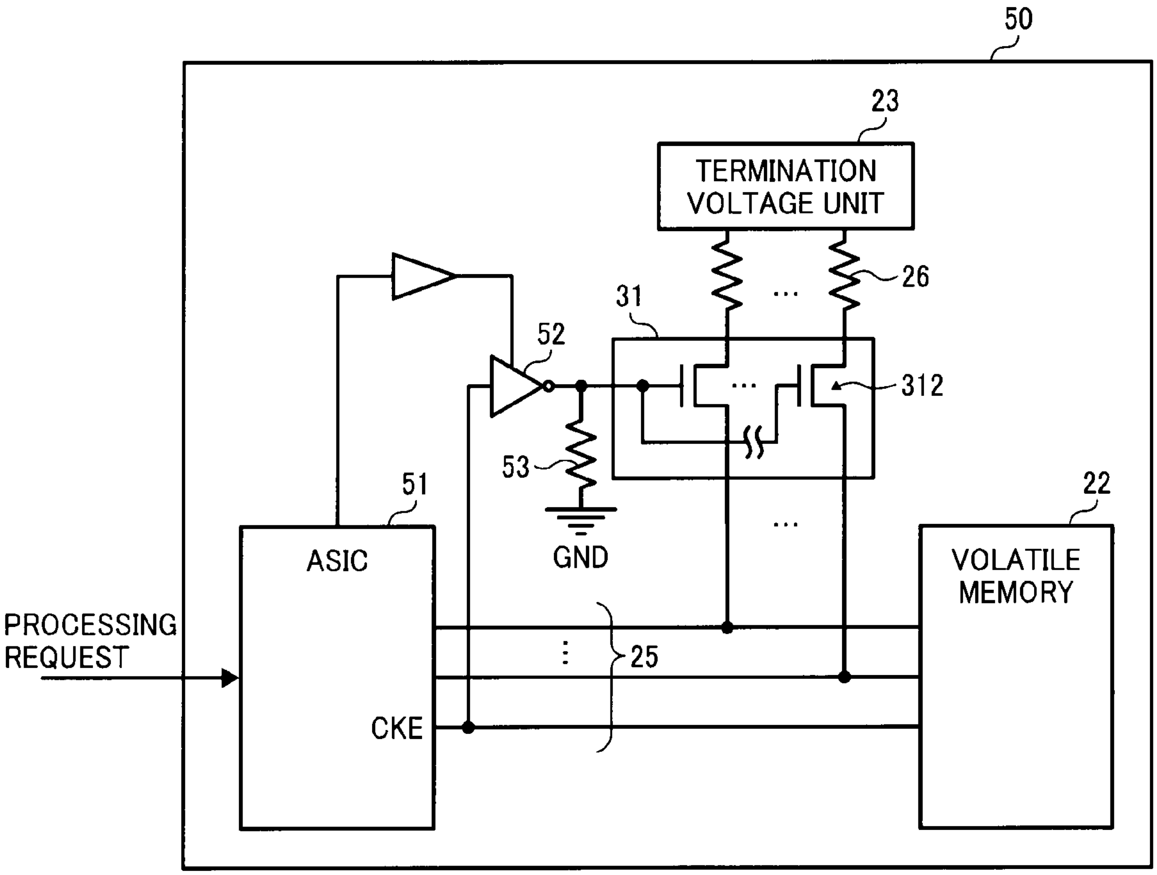
FIG. 9 is a block diagram of a data processing unit according to a fourth embodiment of the present invention.

FIG. 9 is a block diagram of a data processing unit 50 according to a fourth embodiment that can be used as the data processing unit 152. The data processing unit 50 includes an ASIC 51, the volatile memory 22, the termination voltage unit 23, the power supply interrupting unit 31, a tri-state inverting circuit 52, and a pull-down resistor 53.

A basic operation performed by the ASIC 51 is the same as that of the ASIC 41. However, the ASIC 51 outputs a control signal to invalidate the contribution of the CKE signal to the power supply interrupting unit 31, to the gate terminal of the tri-state inverting circuit 52. The CKE signal of the ASIC 51 is output to the volatile memory 22, and also to an X terminal of the tri-state inverting circuit 52.

The tri-state inverting circuit 52 is a logic circuit (tri-state buffer) that outputs a high (H) level value, a low (L) level value, and a high impedance (Hiz) value, which is neither the high (H) level state nor the low (L) level state. The tri-state inverting circuit 52 outputs a value determined depending on a signal value received by the gate terminal and the X terminal, in an inverted state, to the gate terminal of the FET 312. More specifically, the tri-state inverting circuit 52 outputs a high impedance (Hiz) value when the signal level received by the gate terminal and the X terminal is "low (L), low (L)" or "low (L), high (H)", outputs the high (H) level value when the signal level received by the gate terminal and the X terminal is "high (H), low (L)", and outputs the low (L) level value when the signal level received by the gate terminal and the X terminal is "high (H), high (H)".

The FET 312 is a depression-type FET and has the logic inverted from that of the FET 311. In other words, the termination voltage to be supplied to the connecting lines 25 from the termination voltage unit 23 is interrupted, because the high (H) level voltage is applied to the gate terminal of each of the FETs 311. The termination voltage is supplied to the connecting lines 25 from the termination voltage unit 23, because the low (L) level voltage is applied to the gate terminal of each of the FETs 311.

One end of the pull-down resistor 53 is connected between the tri-state inverting circuit 52 and the gate terminal of the FET 312. The other end of the pull-down resistor 53 is connected to ground, and pulls down the signal value in a high impedance state output from the tri-state inverting circuit 52, to a ground level.

In the structure shown in FIG. 9, the ASIC 51 can invalidate the contribution of the CKE signal to the power supply interrupting unit 31, by turning the level of the power supply control signal output to the tri-state inverting circuit 52 to low (L) level. The contribution of the CKE signal to the power supply interrupting unit 31 can be validated, by turning the level of the power supply control signal to high (H) level. The validation and the invalidation of the CKE signal by the power supply control signal will now be explained.

Figure 10:
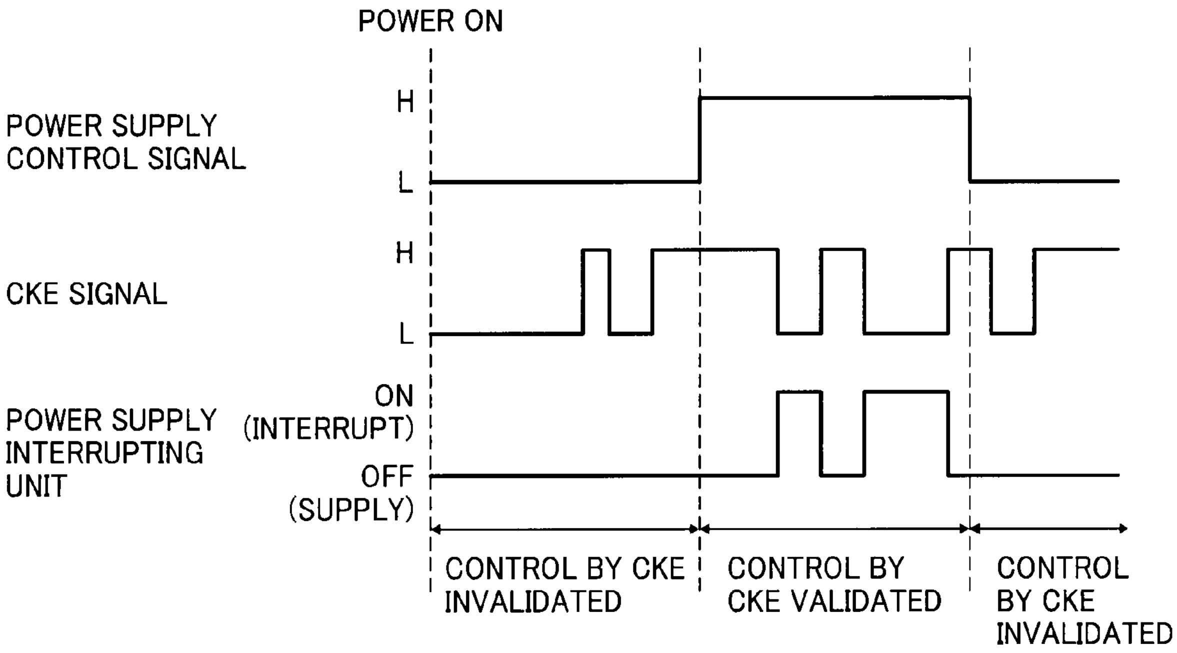
FIG. 10 is a timing chart of relationships among a power supply control signal, a clock enable (CKE) signal, and an operation performed by a power supply interrupting unit according to the fourth embodiment.

FIG. 10 is a timing chart of relationships among the power supply control signal, the CKE signal, and an operation performed by the power supply interrupting unit 31. FIG. 10 is an example that the operation of the image forming apparatus 100 is started by turning on the power, but it is not limited to this.

As shown in FIG. 10, when the power of the image forming apparatus 100 is turned on, the ASIC 51 outputs a power supply control signal of a low (L) level to the tri-state inverting circuit 52. At this time, even if the level of the CKE signal is changed, the voltage received by the power supply interrupting unit 31 (gate terminal of FET 312) is turned to a low (L) level, in other words, in a negated state. This is due to the action of the tri-state inverting circuit 52 and the pull-down resistor 53. Accordingly, the termination voltage is supplied to the connecting lines 25 from the termination voltage unit 23. In other words, the contribution of the CKE signal to the power supply interrupting unit 31 is invalidated, because the ASIC 51 outputs the power supply control signal of a low (L) level.

When the ASIC 51 outputs the power supply control signal of a high (H) level at a predetermined timing, the voltage fed into the power supply interrupting unit 31 (gate terminal of FET 312) is turned to a high (H) level, only when the CKE signal is in a low (L) level. This is due to the action of the tri-state inverting circuit 52. Accordingly, the termination voltage to be supplied to the connecting lines 25 from the termination voltage unit 23 is interrupted. In other words, the contribution of the CKE signal to the power supply interrupting unit 31 is validated, because the ASIC 51 outputs the power supply control signal of a high (H) level.

From then on, when the power supply control signal is switched to the low (L) level from the high (H) level, irrespective of the data processing state of the ASIC 51, the voltage received by the power supply interrupting unit 31 (gate terminal of FET 312) is turned to a low (L) level, and the contribution of the CKE signal to the power supply interrupting unit 31 is invalidated.

In this manner, the contribution of the CKE signal to the power supply interrupting unit 31 can be switched between validation and invalidation, by the control of the ASIC 51. Accordingly, it is possible to reduce the power consumption of the termination voltage at any period of time, depending on the usage environment.

The timing to switch the power supply control signal between a low (L) level and a high (H) level, is not limited to the above example, but may be switched at any time.

As a fifth embodiment, an example of a structure that invalidates the contribution of the CKE signal to the power supply interrupting unit 31, by an energy saving shift signal that instructs to shift to the energy saving mode received from outside, in the structure explained in the fourth embodiment, will be explained. The elements being the same as those of the first embodiment, the second embodiment, the third embodiment, and the fourth embodiment are denoted by the same reference numerals, and the descriptions thereof will be omitted accordingly.

Figure 11:
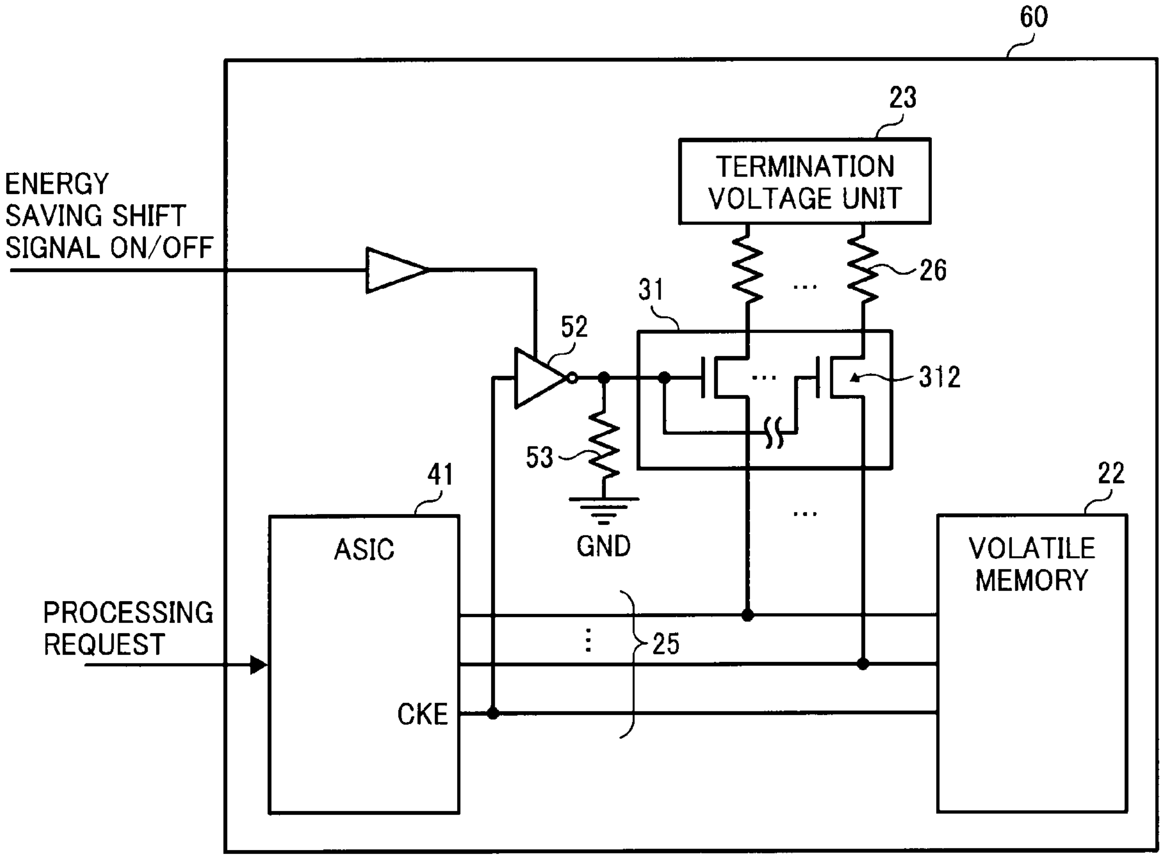
FIG. 11 is a block diagram of a data processing unit according to a fifth embodiment of the present invention.

FIG. 11 is a block diagram of a data processing unit 60 according to a fifth embodiment that can be used as the data processing unit 152. The data processing unit 60 includes the ASIC 41, the volatile memory 22, the termination voltage unit 23, the power supply interrupting unit 31, the tri-state inverting circuit 52, and the pull-down resistor 53.

As shown in FIG. 11, the gate terminal of the tri-state inverting circuit 52 receives an energy saving shift signal that instructs to shift to an energy saving mode, fed from an external circuit such as the CPU 151. The "energy saving mode" is a special operating state to suppress the power consumption of the image forming apparatus 100, and called a sleep mode. With the special operating state, there are levels of states in several stages, depending on how much energy can be saved.

For example, there are some operating states such as reducing the clock speed of the CPU 151 and stopping the power supply to a device in the apparatus. Every operating state is shifted depending on the energy saving shift signal output from the CPU 151. However, at this time, the power supplied from the termination voltage unit 23 is interrupted, while the data processing is not carried out in the ASIC 41, as the "energy saving mode".

Among the energy saving shift signals fed from the CPU 151, the high (H) level signal instructs to shift to the energy saving mode (hereinafter, "energy saving shift signal ON"), and the low (L) level signal instructs to shift to a normal operating state (normal operation mode) that is not the energy saving mode. In other words, because the energy saving shift signal becomes the same as the supply control signal in the fourth embodiment, the invalidation/validation of the contribution of the CKE signal to the power supply interrupting unit 31, is controlled by the signal level of the energy saving shift signal. In the following, the high (H) level energy saving shift signal is called "ON state", and the low (L) level energy saving shift signal is called "OFF state".

The trigger to shift to the energy saving mode may be anything. The energy saving shift signal may be turned to a high (H) level, for example, when the CPU 151 confirms that each of the function units (the reading unit 11, the image forming unit 12, the post-processing unit 13, the facsimile unit 14, and the display/operating unit 16) is not performing the process for a predetermined period of time, or when a user explicitly instructs to shift to the energy saving mode, via the display/operating unit 16 and the like.

The trigger to return from the energy saving mode may also be anything. The energy saving shift signal may be turned to a low (L) level, for example, when the display/operating unit 16 and the like is operated by a user, or when the CPU 151 detects that an original is laid on the reading unit 11, by the output signal from a sensor, which is not shown.

Figure 12:
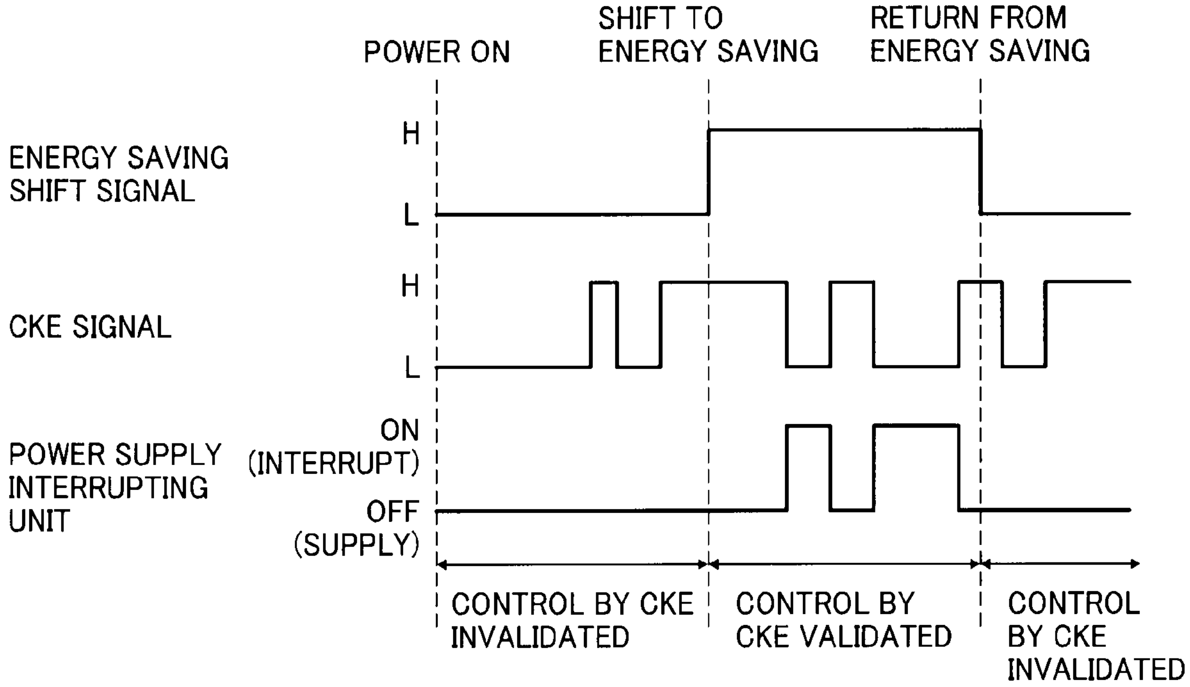
FIG. 12 is a timing chart of relationships among an energy saving shift signal, the CKE signal, and the operation performed by the power supply interrupting unit according to the fifth embodiment.

FIG. 12 is a timing chart of relationships among the energy saving shift signal, the CKE signal, and the operation performed by the power supply interrupting unit 31. FIG. 12 is an example in which the operation of the image forming apparatus 100 is started by turning on the power, but it is not limited to this.

As shown in FIG. 12, when the power of the image forming apparatus 100 is turned on, the CPU 151 outputs the energy saving shift signal in an OFF state to the tri-state inverting circuit 52. At this time, even if the level of the CKE signal is changed by the data processing state of the ASIC 41, the voltage fed into the power supply interrupting unit 31 (gate terminal of FET 312) is in a low (L) level, in other words, in a negated state. This is due to the action of the tri-state inverting circuit 52 and the pull-down resistor 53. Accordingly, the termination voltage is supplied to the connecting lines 25 from the termination voltage unit 23. In other words, the contribution of the CKE signal to the power supply interrupting unit 31 is invalidated, when the energy saving mode of the image forming apparatus 100 is in an OFF state.

When the CPU 151 outputs the energy saving shift signal in an ON state, the voltage fed into the power supply interrupting unit 31 (gate terminal of FET 312) is turned to a high (H) level, only when the CKE signal is in a low level. This is due to the action of the tri-state inverting circuit 52. Accordingly, the termination voltage to be supplied to the connecting lines 25 from the termination voltage unit 23 is interrupted. In other words, the contribution of the CKE signal to the power supply interrupting unit 31 is validated, when the energy saving mode of the image forming apparatus 100 is in an ON state.

From then on, when the energy saving shift signal is switched from the ON state to the OFF state, in other words, when it is instructed to return from the energy saving mode, the voltage fed into the power supply interrupting unit 31 (gate terminal of FET 312) is turned to a low (L) level, irrespective of the data processing state of the ASIC 41. Accordingly, the contribution of the CKE signal to the power supply interrupting unit 31 is invalidated.

Figure 13:
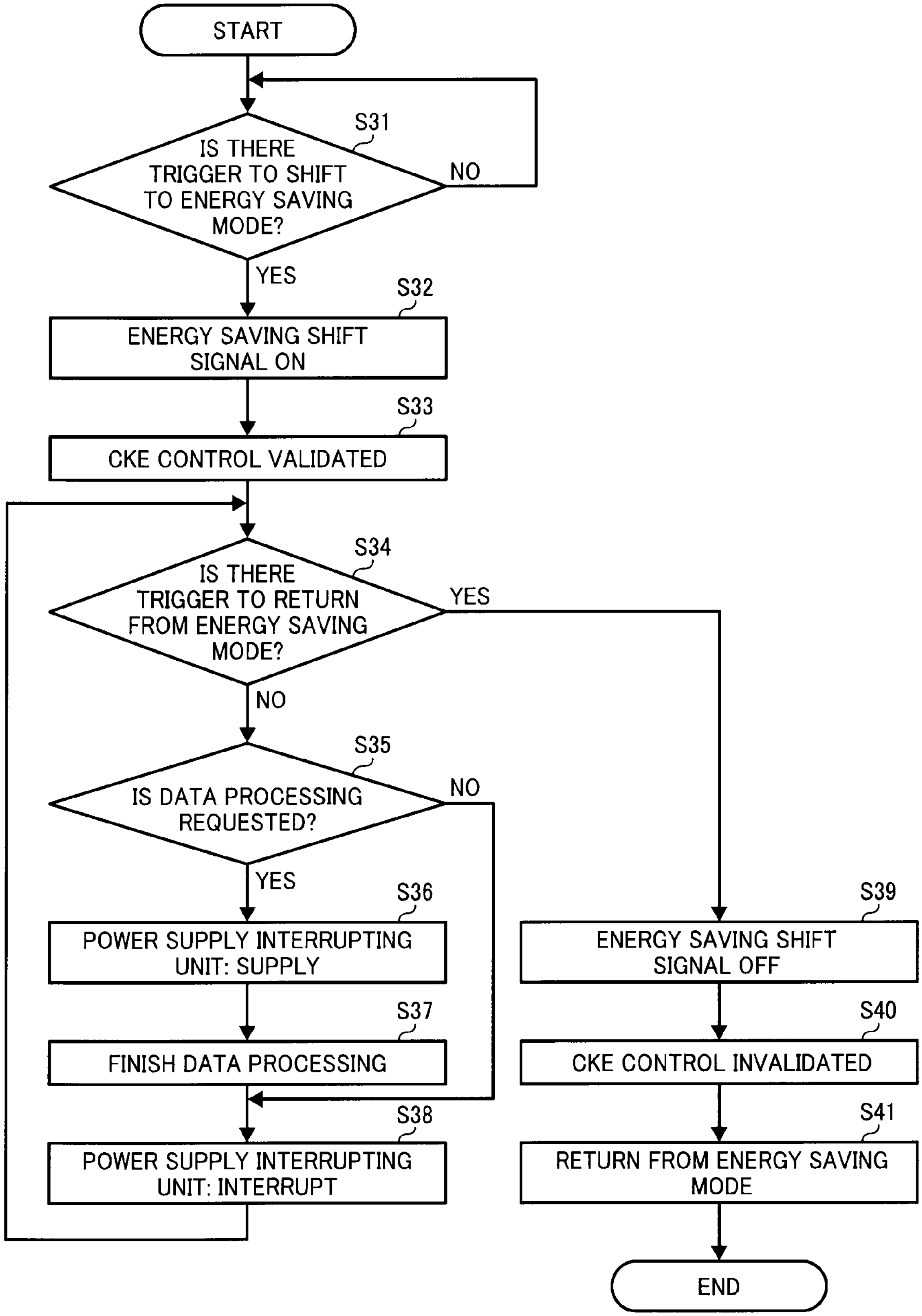
FIG. 13 is a flowchart of an energy saving control performed by the data processing unit shown in FIG. 11.

An operation performed by the data processing unit 60 will now be explained with reference to FIG. 13. FIG. 13 is a flowchart of an energy saving control executed by each unit of the data processing unit 60.

The CPU 151 determines whether there is a trigger for shifting to the energy saving mode, continuously or at an interval of a predetermined period of time (Step S31). If the CPU 151 confirms that there is the trigger for shifting to the energy saving mode (Yes at Step S31), the CPU 151 feeds the energy saving shift signal in an ON state into the gate terminal of the tri-state inverting circuit 52 (Step S32). Accordingly, the contribution of the CKE signal to the power supply interrupting unit 31 is validated (Step S33).

The CPU 151 then determines whether there is a trigger to return from the energy saving mode (Step S34). If it is determined that there is no trigger to return from the energy saving mode (No at Step S34), the energy saving shift signal is maintained in an ON state. The ASIC 41 then determines whether a request for executing the data processing is received from the CPU 151 (Step S35).

If it is determined that the processing request is received (Yes at Step S35), the ASIC 41 executes the requested data processing. During this time, because the CKE signal of the ASIC 41 is in a high (H) level, the power supply interrupting unit 31 supplies the termination voltage from the termination voltage unit 23 to the connecting lines 25 (Step S36).

When the ASIC 41 finishes the requested data processing (Step S37), the CKE signal of the ASIC 41 is turned to a low (L) level. Accordingly, the power supply interrupting unit 31 interrupts the termination voltage to be supplied to the connecting lines 25 from the termination voltage unit 23 (Step S38), and returns again to the processing at Step S34.

If it is determined that the processing request is not yet received (No at Step S35), because the CKE signal of the ASIC 41 is in a low (L) level, the power supply interrupting unit 31 interrupts the termination voltage to be supplied to the connecting lines 25 from the termination voltage unit 23 (Step S38), and returns again to the processing at Step S34.

If it is confirmed that there is the trigger to return from the energy saving mode (Yes at Step S34), the CPU 151 feeds the energy saving shift signal in an OFF state into the gate terminal of the tri-state inverting circuit 52 (Step S39). In this manner, the contribution of the CKE signal to the power supply interrupting unit 31 is invalidated (Step S40). The CPU 151 then returns the image forming apparatus to the normal operation mode from the energy saving mode (Step S41), and finishes the present processing.

In this manner, the contribution of the CKE signal to the power supply interrupting unit 31 can be switched between validation and invalidation, based on the energy saving shift signal received from the CPU 151 outside of the data processing unit 60. Accordingly, it is possible to reduce the power consumption of the termination voltage, while the image forming apparatus 100 is in the energy saving mode.

The present invention was explained using the first to the fifth embodiments. However, the embodiments may be changed or modified in various ways. The structures and the functions explained in the first to the fifth embodiments may also be freely combined.

For example, an example of applying a data processing device (data processing units 20, 30 (30*a*), 40, 50, and 60) to the image forming apparatus has been explained above. However, it is not limited to this, and an information processing device such as a personal computer (PC) may be applied.

According to an aspect of the present invention, the power supply interrupting unit that turns on/off the termination voltage depending on the data processing state of the data processing unit is provided between the connecting lines and the termination resistor. Accordingly, the termination voltage can be interrupted depending on the data processing state of the data processing unit, without dividing a termination voltage system and a voltage plane. Subsequently, it is possible to reduce the arrangement space, and effectively reduce the power consumption of the termination voltage. Because the current that flows through the power supply interrupting unit can be suppressed, a small and inexpensive semiconductor switch can be used as the power supply interrupting unit. As a result, it is possible to suppress an increase in size and cost of the circuit that corresponds to the interrupting unit.

According to another aspect of the present invention, the termination voltage can be turned off, if there is no data to be processed in the data processing unit. As a result, it is possible to effectively reduce the power consumption of the termination voltage.

According to still another aspect of the present invention, the termination voltage can be turned off, if there is no data to be processed in the data processing unit, by using the existing signal in the data processing unit, without preparing a function for controlling the power supply interrupting unit. As a result, it is possible to suppress an increase in the number of components and in cost, and effectively reduce the power consumption of the termination voltage.

According to still another aspect of the present invention, the contribution of a specific signal to the power supply interrupting unit can be switched between validation and invalidation, by the data processing unit. As a result, it is possible to reduce the power consumption of the termination voltage, in a predetermined period of time depending on the usage environment.

According to still another aspect of the present invention, the contribution of the specific signal to the power supply interrupting unit can be switched between validation and invalidation, depending on an invalid control signal received from outside. As a result, it is possible to reduce the power consumption of the termination voltage, in a predetermined period of time depending on the usage environment.

According to still another aspect of the present invention, the power supply control of the termination voltage is not required, with a communication line in a high impedance state, if there is no data to be processed in the data processing unit. As a result, it is possible to reduce the number of components, by not connecting the power supply interrupting unit.

According to still another aspect of the present invention, it is possible to suppress an increase in size and cost of the circuit, by using the semiconductor switch as the power supply interrupting unit.

According to still another aspect of the present invention, the termination resistor can be eliminated, by using the resistance generated in the semiconductor switch when the power is supplied, as the termination resistor. As a result, it is possible to reduce the number of components.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A data processing apparatus comprising:

a storage unit configured to store data;

a processing unit configured to carry out a predetermined data processing on the data in the storage unit, the storage unit being connected to the processing unit with a plurality of connecting lines;

a voltage generating unit that is connected to each of the connecting lines via a corresponding termination resistor and that generates a termination voltage to be applied to the connecting lines;

an interrupting unit that is connected between the connecting lines and the termination resistors, and that applies or does not apply the termination voltage to the connecting lines depending on a data processing state of the processing unit; and an invalidation unit to which a first signal that is output from the processing unit is input, wherein the invalidation unit is configured to control a contribution of power supply control to the interrupting unit by the first signal, based on a second signal received from the processing unit, wherein the second signal is an energy saving shift that instructs to shift to an energy saving mode, is input from outside the data processing apparatus, and contributes to the first signal that is related to the power supply control to the interrupting unit; and the storage unit is configured to receive the first signal from the processing unit and determine the data processing state of the processing unit based on the received first signal.

2. The data processing apparatus according to claim 1, wherein the interrupting unit monitors a level of a specific signal flowing through one of the connecting lines and applies or does not apply the termination voltage to the connecting lines based on monitored levels, the specific signal being a signal whose level changes depending on the data processing state of the processing unit.

3. The data processing apparatus according to claim 1, wherein the storage unit, if no access has been made from the processing unit for a predetermined period of time, has a function to shift to an operating state that power consumption is suppressed, and if shifted to the operating state, turns a logic of a terminal connected to the connecting lines to a high impedance state.

4. The data processing apparatus according to claim 3, wherein among the connecting lines, if there is no data to be processed in the processing unit, a connecting line connected to the terminal that the logic of the terminal in the processing unit is in a high-impedance state, is not connected to the interrupting unit.

5. The data processing apparatus according to claim 1, wherein the interrupting unit is a semiconductor switch.

6. The data processing apparatus according to claim 5, wherein the semiconductor switch is resistance generated when the power is supplied.

7. A data processing method, implemented on a data processing apparatus, comprising:

storing data at a storage unit of the data processing apparatus;

performing predetermined data processing on the data in the storage unit at a processing unit of the data processing apparatus which is connected to the processing unit with a plurality of connection lines;

generating a termination voltage to be applied to the connecting lines at a voltage generating unit of the data processing apparatus that is connected to each of the connecting lines via a corresponding termination resistor;

applying or not applying the termination voltage to the connecting lines, at an interrupting unit that is connected between the connecting lines and the termination resistors, depending on a data processing state of the processing unit;

outputting a first signal from the processing unit to an invalidation unit of the data processing apparatus and to the storage unit;

controlling, at the invalidation unit, a contribution of power supply control to the interrupting unit by the first signal, based on a second signal received from the processing unit;

wherein the second signal is an energy saving shift that instructs to shift to an energy saving mode, is input from outside the data processing apparatus; and contributes to the first signal that is related to the power supply control to the interrupting unit; and determining, at the storage unit, a data processing state of the processing unit based on the first signal that is output from the processing unit.

8. An image forming apparatus comprising:

a storage unit configured to store data;

a processing unit configured to carry out a predetermined data processing on the data in the storage unit, the storage unit being connected to the processing unit with a plurality of connecting lines;

a voltage generating unit that is connected to each of the connecting lines via a corresponding termination resistor and that generates a termination voltage to be applied to the connecting lines;

an interrupting unit that is connected between the connecting lines and the termination resistors, and that applies or does not apply the termination voltage to the connecting lines depending on a data processing state of the processing unit; and an invalidation unit to which a first signal that is output from the processing unit is input, wherein the invalidation unit is configured to control a contribution of power supply control to the interrupting unit by the first signal, based on a second signal received from the processing unit, wherein the second signal is an energy saving shift that instructs to shift to an energy saving mode, is input from outside the image forming apparatus, and contributes to the first signal that is related to the power supply control to the interrupting unit; and the storage unit is configured to receive the first signal from the processing unit and determine the data processing state of the processing unit based on the received first signal.

* * * * *